May 22, 1962

B. G. BENDER 3,036,250

SEMICONDUCTOR DEVICE

Filed June 11, 1958

Bob G. Bender,
*INVENTOR.*

*BY.*

Billy A. Robbins

*ATTORNEY.*

3,036,250
SEMICONDUCTOR DEVICE
Bob G. Bender, Garden Grove, Calif., assignor to Hughes Aircraft Company, Culver City, Calif., a corporation of Delaware
Filed June 11, 1958, Ser. No. 741,269
7 Claims. (Cl. 317—234)

This invention relates generally to semiconductor devices and more particularly to an improved means for anchoring a semiconductor body to be utilized within a semiconductor device.

In the prior art it has been customary to mount semiconductor bodies within a housing for encapsulating same by utilizing a thermosetting compound containing conductive metallic particles suspended therein, or by soldering the semiconductor body to a post or other element for mounting, or by utilizing pressure upon the semiconductor body as by a spring in order to retain it in place.

When a thermosetting compound is utilized several disadvantages result even though for some applications such a compound works quite well. One of the disadvantages realized, however, is that the use of a thermosetting compound requires separate and distinct hand operations for each device and, generally, requires special equipment and special handling of the semiconductor body during mounting in order to acquire a good mechanical bond and to prevent short circuiting of any junction which may be in a surface of the semiconductor body. Such a compound also requires time consuming baking at high temperatures in order to volatilize any solvent which may be present and cause the compound to harden and thus bond the body to the post or other element which is to serve as the mount therefor. Since thermosetting compounds contain solvents and the like, this in itself presents the opportunity for the presence of contaminants to the semiconductor body surface within the completed package since it is often times quite difficult, if not impossible, to volatilize all foreign matter which may be present in the compound. Even after baking and proper volatilization of any foreign impurities, most thermosetting compounds have a relatively low survival temperature, thus requiring lower temperatures during the operation and storage of the device than may be desired for some applications.

When a semiconductor body is soldered directly to the post or element upon which it is to be mounted, flux may be required in order to obtain a desirable soldered joint. When flux is utilized, it is again quite possible that contaminants will be trapped within the completed package, thus causing deterioration of the semiconductor body surface. Similar to the thermosetting compounds, most solders which can be used for affixing a semiconductor body to its mounting member have relatively low melting points, thus necessitating operation and storage of the device at a low temperature so that it may survive such operation or storage.

If pressure is relied upon to maintain the semiconductor body in contact with its mount, it becomes quite difficult to maintain positive contact between the body and the elements in contact therewith when the device is subjected to acceleration or vibration. In many instances pressures, due to acceleration, will cause the spring member that is used to obtain the pressure contact between the body and its mount to deform and thereby allow the semiconductor body to move about upon its mount, thus creating microphonic noise.

When any of the above types of mounts are utilized for affixing a semiconductor body within a package, it has been found that there is a limited heat conductive path from the semiconductor body, thus limiting the amount of current which may be carried by the body.

Accordingly, it is an object of the present invention to provide a means for anchoring a semiconductor body which remains stable at high temperatures, therefore, providing high operating and survival temperatures for semiconductor devices.

It is another object of the present invention to provide a means for anchoring a semiconductor body which eliminates the possibility of contaminants being trapped within the packaged device.

It is still another object of the present invention to provide a mount for a semiconductor body which reduces the number of steps and eliminates special handling equipment which have heretofore been required in the production of semiconductor devices.

It is further object of the present invention to provide a mount for a semiconductor body which gives positive contact under extreme acceleration pressures and vibrations, therefore, eliminating unwanted noise from semiconductor device operation.

It is a further object of the present invention to provide a mount for a semiconductor body that gives improved thermal conductivity from the semiconductor body.

It is a still further object of the present invention to provide a mount for a semiconductor body which requires less time to construct than heretofore needed.

An improved semiconductor device in accordance with the present invention includes a semiconductor body, a mounting member for the body and a eutectic alloy affixing the body to the mounting member, the eutectic alloy including cadmium as a constituent thereof.

More specifically in accordance with the present invention an improved mount for semiconductor bodies includes a member containing cadmium which is alloyed into at least a portion of an electrical conductor. The body is affixed to the member by an additional alloy which contacts both the body and the pedestal and which includes the material from the pedestal.

Other and more specific objects of the present invention will become apparent from a consideration of the following description taken in conjunction with the accompanying drawing which is presented by way of example only for purposes of illustration and is not intended to define the limits of this invention and in which.

Figure 1:
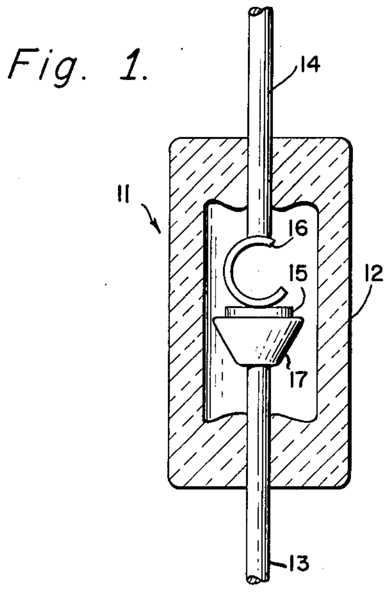
FIG. 1 is a schematic diagram partly in cross section illustrating an encapsulated device constructed in accordance with the present invention.

Referring now to the drawing and more particularly to FIG. 1 thereof, there is shown a semiconductor diode 11. Diode 11 includes a housing 12 which encapsulates a semiconductor body and its electrical contacts. Housing 12 may be constructed from an insulative material, such as glass, as illustrated in FIG. 1. It is to be understood, however, that a housing may be constructed of any material which is desired. If a glass package, such as shown at 12 in FIG. 1, is utilized it may be constructed as described in Patent No. 2,736,847, issued to S. H. Barnes on February 28, 1956. Electrical conductors 13 and 14 protrude through and into housing 12 and provide a hermetic seal for the semiconductor diode contained within the housing. Attached to electrical conductor or lead 13 is a member or pedestal 17 upon which semiconductor body 15 is mounted. An additional electrode 16 is in contact with lead 14 and semiconductor body 15. Electrode 16 may be a spring taking the form of a C as illustrated in FIG. 1, or in the alternative it may be S-shaped, or a typical point contact or whisker electrode which is well known in the art.

Figure 2:
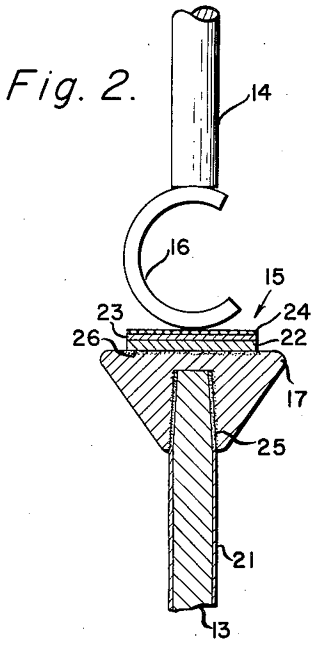
FIG. 2 is a schematic diagram partly in cross-section illustrating more in detail a portion of the device as shown in FIG. 1, and FIGS. 3 and 4 are schematic diagrams partly in cross section of alternative embodiments of semiconductor devices which may be constructed in accordance with the present invention.

Referring now more particularly to FIG. 2, the internal portions of device 11, as illustrated in FIG. 1, are shown more in detail. As illustrated in FIG. 2, lead 13 contains an outer coating 21. Outer coating 21 is a material which will alloy with the material utilized for member 17 and may be applied to lead 13 by any means known to the art such as, for example, plating, evaporating, dipping, cladding, and the like. In the alternative, lead 13 may be constructed entirely of material which will alloy with the material of member 17. Member of pedestal 17 includes as at least one of its constituents the element cadmium. In the presently preferred embodiment, therefore, layer 21 on lead 13 may include at least one of antimony, lead, nickel, silver, gold, copper, tin, zinc, aluminum or magnesium.

Pedestal 17 may be placed upon lead 13 for example in the following manner. A slug of cadmium or of an alloy of cadmium and one of the materials above listed may be placed upon lead 13 as contained within an open-ended portion of the encapsulating means 12 as illustrated in FIG. 1. A weight is then inserted within the open-ended encapsulating means to rest upon the slug of material and to exert slight pressure between it and lead 13. This combination is then passed through a furnace, such as a tape furnace, wherein the temperature is raised to above the melting point of the slug of material in order to cause it to melt and assume the shape as shown in FIG. 1 or FIG. 2. Upon melting, it will also dissolve that portion of coating 21 upon lead 13 which it contacts thereby forming an alloy mixture between the two materials. If, for example, coating 21 upon lead 13 is copper and pedestal 17 is constructed of cadmium, the temperature to which the combination would be raised would be approximately 321° C. The combination is then cooled to thereby form an alloy bond as illustrated at 25 in FIG. 2 between pedestal 17 and lead 13. Alloy bond 25 will in most instances be a eutectic alloy between the coating 21 and pedestal 17.

Semiconductor body 15, which as illustrated in FIG. 2, includes a semiconductor crystal 22 having therein a region 23 which is of the opposite conductivity type from crystal 22 and in contact with region 23 an alloy 24 consisting of atoms of the semiconductor crystal and of the material deposited thereon to form region 23. A semiconductor body as illustrated in FIG. 2 may be constructed in accordance with Patent No. 2,789,068 issued to J. Maserjian on April 16, 1957. While such a semiconductor body is illustrated in FIG. 2, it is to be expressly understood that the body may take any form presently known to the art and may be constructed by any method presently known to the art such as, for example, fusion, diffusion, particle bombardment, and the like in order to form junctions or may simply be a body of semiconductor material having a whisker element in contact relationship therewith. The semiconductor body is brought into contact with pedestal 17 and a slight pressure is exerted therebetween. The body and the pedestal are then heated to a temperature so that an alloy is formed including material from pedestal 17 whereby body 15 is bonded to pedestal 17.

This alloy may be formed in the presently preferred embodiment of the present invention by applying a layer of material to that surface of crystal 22 which is to be brought into contact with pedestal 17. The material applied may be any of the materials above listed which will form an alloy with pedestal 17. In the presently preferred embodiment, a layer of gold is applied to semiconductor crystal 22. The thickness of the layer of gold is not considered to be critical so long as sufficient gold is present to form an alloy with pedestal 17 and it has been found that 0.2 mil in thickness is sufficient to accomplish this. If gold is used as the material on crystal 22 and cadmium as the material for pedestal 17, the combination is heated to approximately 315° C. which is slightly above the eutectic temperature of cadmium-gold and is below the melting temperature of cadmium. By utilizing such a temperature, the shape of pedestal 17 which was originally achieved is not disturbed. It should be pointed out, however, that this is not critical and if the shape of pedestal 17 is immaterial, the temperature may be raised well above the melting point of cadmium so long as the deteriorating temperature of the device components is not reached.

The combination is then cooled to form an alloy as illustrated at 26 which bonds semiconductor body 15 to pedestal 17. This bond has been found to be exceedingly rigid and tenacious; for example, semiconductor body 15 cannot be removed from pedestal 17 after bonding as above described without first fracturing the body 15 and thereafter removing the bits of material which remain. Although the bonding of pedestal 17 to lead 13 and the bonding of body 15 to pedestal 17 has hereinabove been described as two separate steps, it should be understood that this may be accomplished in a single step.

Although each of the materials listed above have been found to work well in the formation of an alloy with cadmium, tin and lead should not be used if it becomes desirable to produce a semiconductor device which has a survival temperature of the order of 300° C. Under such circumstances the remaining materials listed provide excellent bonds. In order to provide an indication of probable temperature limits of devices constructed with the various materials above set forth but without restricting the scope of the present invention, the following table is provided:

| Material Alloyed with Cadmium | Percent Cadmium in Eutectic | Eutectic Temperature, Degrees C. |
|---|---|---|
| Lead | 17.5 | 248 |
| Antimony | 92.5 | 290 |
| Nickel | 97.5 | 318 |
| Silver | 93–97 | 343–400 |
| Gold | 88 | 309 |
| Copper | 88 | 314 |
| Tin | 67.75 | 170 |
| Zinc | 82.5 | 265 |
| Aluminum 21% / Magnesium 53% | 26 | 420 |

After the body and the pedestal are bonded as hereinabove described, lead 14 having electrode 16 attached thereto may then be brought into contact with the alloyed region 24 of device 15 and the housing sealed to provide the configuration as shown in FIG. 1. It is, therefore, seen that a completed device is provided wherein the semiconductor body is rigidly affixed to its mounting member by providing an alloy bond therebetween. Alloy bond 26 will in most instances be a eutectic alloy of the material applied to body 15 and the material in pedestal 17. It should be understood, of course, that the alloy bond between body 15 and pedestal 17 may be provided in any number of ways. The material which is to provide the bond between pedestal 17 and body 15 may be applied directly to pedestal 17 as opposed to the surface of crystal 22. The layer of material may be applied in any number of ways such as, for example, electroless or electro-plating, evaporation, alloying or the like.

Figure 3:
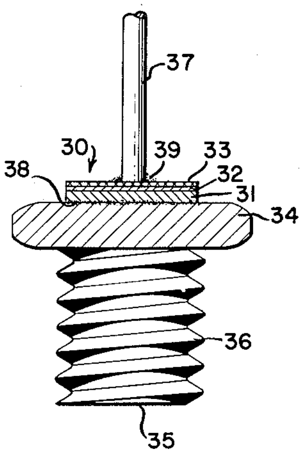

An alternative embodiment of the device in accordance with the present invention is illustrated in FIG. 3 to which reference is hereby made. Illustrated therein is a member 34 which includes a stud 35 having threads 36 thereon. Stud 35 may be utilized for mounting the finished semiconductor device upon a chassis or the like, and is further utilized as a heat sink to improve thermal dissipation characteristics of the device. Mounted upon member 34 is a semiconductor body 30 including a crystal 31, a region 32 having a conductivity type opposite that of the crystal 31 and in contact with region 32 is an alloy 33. The semiconductor body is bonded to member 34 by means of an alloy 38 which contacts both the body and member 34. Alloy 38 may be formed, for example, by applying a layer of cadmium to element 34 and a layer of gold to the surface of crystal 31 and thereafter contacting the two and raising the temperature at least above the eutectic temperature of the two materials. In the alternative, element 34 may be constructed of cadmium or the like and the layer of material applied to the semiconductor body or, if desired, to member 34 which may be any or the materials above set forth. A lead 37 is brought into contact with layer 33 of the semiconductor body. Lead 37 may be affixed to the semiconductor body, for example, by means of solder 39 or the like in order to obtain good electrical contact. The combination may thereafter be encapsulated by any means well known to the art in order to provide a finished semiconductor device.

Figure 4:
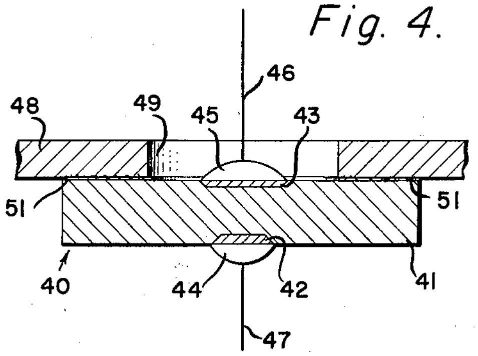

Still another alternative embodiment of the present invention is illustrated in FIG. 4 wherein there is shown a transistor 40 including a semiconductor body 41 having regions 42 and 43 of a conductivity type opposite that of the body 41 and in contact with regions 42 and 43 are buttons 44 and 45, respectively, which provide electrical contact to regions 42 and 43. Leads 46 and 47 are attached to buttons 45 and 44, respectively, by any method which is well known to the prior art. A mounting member 48 is provided to which semiconductor body 41 is attached and which may be used for the dual purpose of providing a base contact and for mounting the transistor within an encapsulating means. Body 41 is attached to mounting member 48 by means of a layer 49 including cadmium which is attached to body 41 or to mounting member 48. A layer of material is then applied to body 41, or in the alternative member 48, which will form an alloy with the cadmium material. The combination is then brought together and heated as hereinabove described in order to form the alloy, which is preferably a eutectic alloy, as illustrated at 51 in order to bond semiconductor body 41 to mounting member 48.

In each of the devices as hereinabove discussed, and as illustrated in the accompanying drawing, an ohmic contact is provided between the semiconductor body and its mounting member. When such a contact is provided, it often times becomes desirable to provide a doping material in order to assure the formation of an ohmic contact. This is usually done by doping the material applied to a semiconductor body in order to form the ohmic contact. Since an alloy is utilized in accordance with the present invention to bond the semiconductor body to its mounting, the doping material may be included within the mounting member itself, for example, in the embodiment as shown in FIG. 2, assuming that semiconductor crystal 22 is constructed of N-type silicon while region 23 is aluminum-doped P-type and region 24 is an aluminum-silicon alloy, pedestal 17 may consist of cadmium containing approximately 1% antimony. If such is the case, upon alloying the formation of an ohmic contact is assured. In the alternative, if it is desirable to form a junction within that region of the semiconductor body which contacts the mounting member, this may be done by including a doping material which will impart an opposite conductivity type from that of the body and the pedestal. Upon forming the alloy, the temperature used will be sufficient to dissolve a portion of the semiconductor body and upon cooling a region thereof will be converted to the opposite conductivity type and at the same time an alloy bond will be formed between the semiconductor body and the pedestal.

There has thus been described a mount for a semiconductor body which eliminates the trapping of foreign contaminants within the completed device which provides a stable bond that gives improved thermal conductivity thereby increasing the current carrying capacity of the semiconductor body.

What is claimed is:

1. A semiconductor device comprising: a semiconductor body of one conductivity type having a region of the opposite conductivity type in at least one surface thereof, an electrical lead, a member including cadmium, a first eutectic alloy between said member and at least a portion of said lead, said semiconductor body being affixed at one surface thereof to said member, a second eutectic alloy between said surface and said member, an electrode contacting another surface of said body, and a housing for encapsulating said device.

2. In a semiconductor device, including a semiconductor body and a housing having at least one electrical conductor contacting said body, the improvement comprising: a member including cadimum affixed to at least a portion of said conductor and forming a first alloy therewith, said body being affixed to said member, and a second alloy contacting said body and said member and including material from said member.

3. A semiconductor device comprising: an envelope having first and second copper coated leads protruding therethrough and extending therein, a cadmium pedestal forming a substantially flat surface and being alloyed with said copper on said first lead, a semiconductor body of one conductivity type having a region of opposite conductivity type in one surface thereof, a layer of gold on another surface thereof, at least a portion of said gold being alloyed with said flat surface of said cadmium pedestal to thereby permanently affix said body to said pedestal, and a contact member affixed to said second lead and providing electrical contact to said opposite conductivity region.

4. A semiconductor device comprising: a semiconductor body, a mounting member for said body, a eutectic alloy between said member and said body for affixing said body to said member, said eutectic alloy including cadmium.

5. A semiconductor device comprising: a silicon semiconductor body, a mounting member consisting essentially of cadmium for said body, a gold-cadmium eutectic alloy between said body and said member for affixing said body to said member.

6. A semiconductor device comprising: a semiconductor body, a mounting member for said body, an electrical contacting element, a first eutectic alloy between said body and said mounting member for affixing said body to said member, a second eutectic alloy between said mounting member and said electrical contacting element, said first and second eutectic alloys including cadmium.

7. A semiconductor device comprising: a silicon semiconductor body, a cadmium mounting member for said body, a gold-cadmium eutectic alloy between said body and said member for affixing said body to said member, an electrical lead, a copper-cadmium eutectic alloy between said lead and said mount for affixing said mount to said lead.

References Cited in the file of this patent

UNITED STATES PATENTS

| | | |
|---|---|---|
| 2,847,335 | Gremmelmaier et al. | Aug. 12, 1958 |
| 2,873,216 | Schnable | Feb. 10, 1959 |
| 2,922,092 | Gazzara et al. | Jan. 19, 1960 |